United States Patent
Joo

(10) Patent No.: US 8,228,740 B2
(45) Date of Patent: Jul. 24, 2012

(54) METHOD OF OPERATING NONVOLATILE MEMORY DEVICE

(75) Inventor: Byoung In Joo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 228 days.

(21) Appl. No.: 12/814,451

(22) Filed: Jun. 12, 2010

(65) Prior Publication Data

US 2010/0315880 A1 Dec. 16, 2010

(30) Foreign Application Priority Data

Jun. 12, 2009 (KR) ........................ 10-2009-0052257

(51) Int. Cl.
*G11C 11/34* (2006.01)
*G11C 16/06* (2006.01)
(52) U.S. Cl. ............................... 365/185.22; 365/185.14
(58) Field of Classification Search ............ 365/185.22, 365/185.14, 185.17
See application file for complete search history.

(56) References Cited

U.S. PATENT DOCUMENTS

| 6,529,413 | B2 * | 3/2003 | Lee et al. | 365/185.22 |
| 7,352,630 | B2 | 4/2008 | Lee et al. | |
| 2002/0069381 | A1 * | 6/2002 | Jeong et al. | 714/704 |
| 2011/0179322 | A1 * | 7/2011 | Lee et al. | 714/719 |

FOREIGN PATENT DOCUMENTS

KR 1020090055762 A 6/2009

OTHER PUBLICATIONS

Korean Notice of Allowance 9-5-2011-006518839 issued Feb. 7, 2011.

* cited by examiner

*Primary Examiner* — Anh Phung
(74) *Attorney, Agent, or Firm* — William Park & Associates Ltd.

(57) ABSTRACT

A nonvolatile memory device is operated by, inter alia, performing a program operation on memory cells belonging to a page selected from among a plurality of pages, performing a verification operation on the programmed memory cells, loading a start loop value of a fail bit count set to the selected page, from among start loop values of fail bit counts set to the respective pages, and if a loop value of the program operation is greater than or equal to the start loop value, counting a number of fail bits included in data of the programmed memory cells detected in the verification operation.

18 Claims, 2 Drawing Sheets

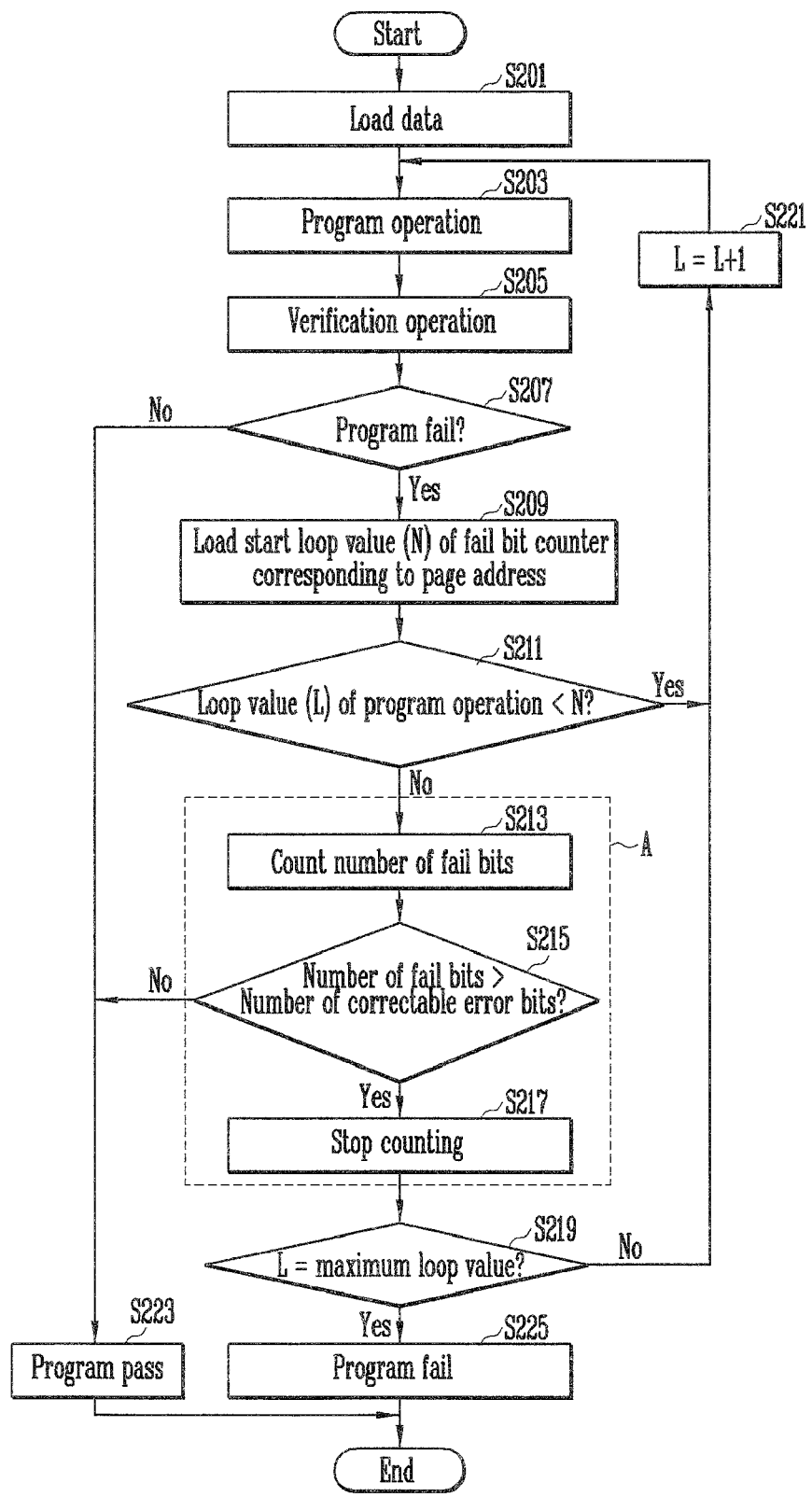

METHOD OF OPERATING NONVOLATILE MEMORY DEVICE

CROSS-REFERENCE TO RELATED APPLICATION

Priority to Korean patent application number 10-2009-0052257 filed on Jun. 12, 2009, the entire disclosure of which is incorporated by reference herein, is claimed.

BACKGROUND

The present invention relates generally to a memory device, and more particularly to a method of operating a nonvolatile memory device.

Nonvolatile memory devices, which are electrically programmable and erasable with no need for a refresh function of rewriting data at specific intervals, are increasingly in demand.

A NAND flash memory device, one type of nonvolatile memory, uses a page buffer in order to store a large amount of information within a short period of time and to verify whether the program and erase operations have been normally performed. A known page buffer utilizes a single register for temporarily storing data but can also utilize a dual register in order to increase the speed of data program.

The operations performed in a nonvolatile memory device include: a program operation for storing data in a memory cell array; a read operation for reading data stored in a memory cell array; and an erase operation for erasing data stored in a memory cell array.

The program operation is performed through a number of program loops. Each program loop includes a program period and a verification period. The program loop is repeatedly performed within a maximum number of the program loops until all selected memory cells are programmed. If the program operation is treated as a program fail within a maximum number of the program loops, the corresponding memory block treated as a program fail is classified as a bad block. Such classification as the bad block is performed irrespective of the number of fail bits. If the number of fail bits is determined to be within the number of bits correctable by an error correction code (ECC) circuit, the fail bits can be corrected by the ECC circuit when a read operation is performed.

In one technique, fail bits included in the data of programmed memory cells (or a programmed page) are counted and, if the counted number of fail bits is within the number of bits correctable by an ECC circuit, the programmed memory cells are (or the programmed paged is) then treated as a program pass. In this known technique, counting of the fail bits is started at the same point of time irrespective of the type of pages on which a program operation is being performed. For example, some program operation conditions such as the number of program pulses can differ depending on the address of a most significant bit (MSB) page or the address of a least significant bit (LSB) page. In the known technique, however, a constant fail bit count operation is always used irrespective of program operation conditions which vary depending on circumstances. Accordingly, there is a problem in that the program operation is inefficiently performed.

BRIEF SUMMARY

Exemplary embodiments relate to a method of operating a nonvolatile memory device, wherein a point of time at which the number of fail bits is counted differs depending on the address of a page.

A method of operating a nonvolatile memory device according to an aspect of the present disclosure comprises performing a program operation on memory cells belonging to a page selected from among a plurality of pages, performing a verification operation on the programmed memory cells, loading a start loop value of a fail bit count set to the selected page, from among start loop values of fail bit counts set to the respective pages, and if a loop value of the program operation is greater than or equal to the start loop value, counting the number of fail bits included in data of the programmed memory cells detected in the verification operation.

The method further comprises, if the loop value of the program operation is less than the start loop value, increasing the loop value of the program operation by 1 and then repeatedly performing the steps of performing a program operation on memory cells belonging to a page selected from among a plurality of pages, performing a verification operation on the programmed memory cells, and loading a start loop value of a fail bit count set to the selected page, from among start loop values of fail bit counts set to the respective pages.

The method further comprises, after counting the number of fail bits included in the data of the programmed memory cells detected in the verification operation, if the number of fail bits counted is the number of error bits or less correctable by an error correction code (ECC) circuit, treating the selected page as a program pass and, if the number of fail bits counted is greater than the number of error bits correctable by the ECC circuit, stopping to count the number of fail bits.

The method further comprises, after stopping to count the number of fail bits, if the loop value of the program operation is equal to a maximum loop value, treating the selected page as a program fail, and if the loop value of the program operation is not equal to the maximum loop value, increasing the loop value of the program operation by 1 and then repeatedly performing the steps of performing a program operation on memory cells belonging to a page selected from among a plurality of pages, performing a verification operation on the programmed memory cells, and loading a start loop value of a fail bit count set to the selected page, from among start loop values of fail bit counts set to the respective pages.

The method further comprises, after performing the verification operation on the programmed memory cells, checking whether the verification operation for the selected page is a pass or a fail and, if, as a result of the check, the verification operation for the selected page is a fail, proceeding to a step of loading a start loop value of a fail bit count set to the selected page, from among start loop values of fail bit counts set to the respective pages.

The start loop value can be set to increase with a page closer to a drain selection line. The start loop value can be set to decrease with a page closer to a drain selection line. The start loop value can be set to increase with pages closer to a source selection line and a drain selection line. The start loop value can be set to decrease with pages closer to a source selection line and a drain selection line.

A method of operating a nonvolatile memory device according to another aspect of the present disclosure comprises classifying a plurality of pages into one or more groups, performing a program operation on memory cells belonging to a page selected from among the pages, performing a verification operation on the programmed memory cells, loading a start loop value of a fail bit count set to a group of the one or more groups to which the selected page belongs, from among start loop values of fail bit counts set to the respective groups, and if a loop value of the program operation is greater than or equal to the start loop value of the group to which the selected page belongs, counting the number of fail bits included in data of the programmed memory cells detected in the verification operation.

The method further comprises, if the loop value of the program operation is less than the start loop value, increasing the loop value of the program operation by 1 and then repeatedly performing the steps of performing a program operation on memory cells belonging to a page selected from among the pages, performing a verification operation on the programmed memory cells, and loading a start loop value of a fail bit count set to a group of the one or more groups to which the selected page belongs, from among start loop values of fail bit counts set to the respective groups.

The method further comprises, after counting the number of fail bits included in the data of the programmed memory cells detected in the verification operation, if the number of fail bits counted is the number of error bits or less correctable by an ECC circuit, treating the selected group as a program pass and, if the number of fail bits counted is greater than the number of error bits correctable by the ECC circuit, stopping to count the number of fail bits.

The method further comprises, after stopping to count the number of fail bits, if the loop value of the program operation is equal to a maximum loop value, treating the selected group as a program fail, and if the loop value of the program operation is not equal to the maximum loop value, increasing the loop value of the program operation by 1 and then repeatedly performing the steps of performing a program operation on memory cells belonging to a page selected from among the pages, performing a verification operation on the programmed memory cells, and loading a start loop value of a fail bit count set to a group of the one or more groups to which the selected page belongs, from among start loop values of fail bit counts set to the respective groups.

The method further comprises, after performing the verification operation on the programmed memory cells, checking whether the verification operation for the selected page is a pass or a fail and, if, as a result of the check, the verification operation for the selected page is a fail, proceeding to a step of loading a start loop value of a fail bit count set to the selected page, from among start loop values of fail bit counts set to the respective pages.

The start loop value can be set to increase with a page closer to a drain selection line. The start loop value can be set to decrease with a page closer to a drain selection line. The start loop value can be set to increase with pages closer to a source selection line and a drain selection line. The start loop value can be set to decrease with pages closer to a source selection line and a drain selection line.

BRIEF DESCRIPTION OF THE DRAWINGS

FIG. 2 is a flowchart illustrating a method of operating a nonvolatile memory device according to an embodiment of this disclosure.

DESCRIPTION OF EMBODIMENTS

Figure 1:
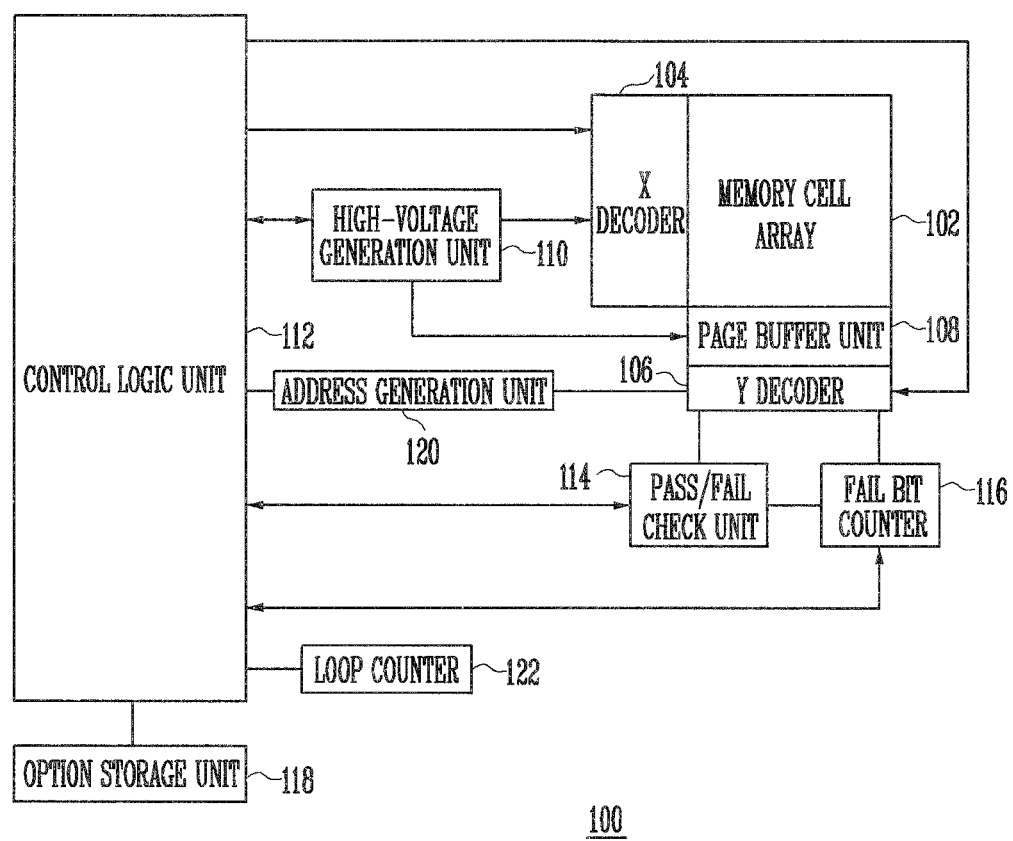
FIG. 1 is a block diagram of a nonvolatile memory device according to an embodiment of this disclosure.

Hereinafter, some exemplary embodiments of the present disclosure will be described in detail with reference to the accompanying drawings. The figures are provided to allow those having ordinary skill in the art to understand the scope of the embodiments of the disclosure.

FIG. 1 is a block diagram of a nonvolatile memory device according to an embodiment of this disclosure.

The nonvolatile memory device 100 includes a memory cell array 102, an X decoder 104, a Y decoder 106, a page buffer unit 108, a high-voltage generation unit 110, a control logic unit 112, a pass/fail check unit 114, a fail bit counter 116, an option storage unit 118, an address generation unit 120, and a loop counter 122.

The control logic unit 112 controls the general operations of the nonvolatile memory device 100 and generates a program command signal, an erase command signal, or a read command signal in response to a signal transmitted and received through an I/O buffer unit (not shown in FIG. 1).

The high-voltage generation unit 110 generates bias voltages in response to a program command, an erase command, or a read command issued by the control unit 112 and supplies them to the page buffer unit 108, the X decoder 104, and others.

The address generation unit 120 is operated under the control of the control logic unit 112 and configured to generate a column address signal.

The X decoder 104 supplies at least one of the memory blocks of the memory cell array 102 with the bias voltages supplied by the high-voltage generation unit 110 in response to a row address signal generated by the control logic unit 112.

The Y decoder 106 supplies a data signal to the page buffer unit 108 in response to the column address signal generated by the address generation unit 120.

The page buffer unit 108 includes a plurality of page buffers for storing the data signal received via the I/O buffer unit and the Y decoder 106 and for outputting the data signal to bit lines jointly shared by the memory blocks of the memory cell array 102. Each of the page buffers stores data read from the memory cell array 102 in a read operation and outputs the stored data externally through the Y decoder 106 and the I/O buffer unit.

The option storage unit 118 stores a start loop value to determine a point of time at which counting of fail bits can start for every page within a memory block. For example, after a set number of program loops are performed within 2 to 5 times, counting of fail bits can start, and this value is referred to as a start loop value of a fail bit count and set differently for every page. Alternatively, pages may be classified into one or more groups, and the start loop value of a fail bit count may be set differently for every group.

In an embodiment of this disclosure, the option storage unit 118 can store the start loop value which is set to increase for a page closer to a drain selection line, the start loop value which is set to decrease for a page closer to a drain selection line, the start loop value which is set to increase for a page closer to a source selection line and a drain selection line, or the start loop value which is set to decrease for pages closer to a source selection line and a drain selection line. In an embodiment of this disclosure, although one of the four kinds of setting methods can be selected and the start loop value can be set in accordance with the selected method, this is only according to an embodiment. It is also possible that the start loop value can be set in various different ways according to same spirit and scope as disclosed in an embodiment of the present invention. For example, the start loop value may be set in various ways depending on a distribution of threshold voltages of the memory cells of a nonvolatile memory device.

The loop counter 122 is controlled by the control logic unit 112 and is configured to count the number of program operation loops.

The pass/fail check unit 114 checks whether it is a program pass on the basis of data read from programmed memory cells in a verification operation. For example, the pass/fail check unit 114 can compare the amount of data stored in programmed memory cells and the amount of data to be programmed, and, if the compared amounts of data are identical or substantially identical to each other, the pass/fail check unit 114 determines a program pass. However, if they are not identical or substantially identical to each other, the pass/fail check unit 114 would render a program fail determination.

The fail bit counter 116 counts the number of fail bits from among data read from the programmed memory cells.

In an embodiment of this disclosure, the control logic unit 112 compares the number of fail bits, output by the fail bit counter 116, and the number of bits correctable by an ECC circuit. If, as a result of the comparison, the number of fail bits is equal to or less than the number of correctable bits, the control logic unit 112 would treat the corresponding memory cells as a program pass.

As described above, a nonvolatile memory device according to an embodiment of this disclosure may use an ECC algorithm. In a nonvolatile memory device using the ECC algorithm, data is stored using the ECC algorithm and any fail data is corrected during a data read using the ECC algorithm. The processing capability of the ECC algorithm used in a nonvolatile memory device is set beforehand depending on the processing capability of a processor used in the control logic unit 112. For example, an ECC algorithm capable of processing n fail bits would be able to correct fail bits only when n or less than n fail bits are generated. If more than n fail bits are generated, the above ECC algorithm would be unable to correct the fail bits. The number of bits correctable by the ECC algorithm is therefore used as the number of allowed fail bits. That is, if the number of fail bits is the number of allowed fail bits or less, the corresponding fail bits can be corrected using the ECC algorithm. Accordingly, even though a page including corresponding memory cells includes the fail bits, an additional program loop is not performed on the page, and so the page is treated as a program pass.

FIG. 2 is a flowchart illustrating a method of operating a nonvolatile memory device according to an embodiment of this disclosure.

First, data to be programmed is loaded into a page buffer unit 108 through the Y decoder 106 at step S201. Selected memory cells in the memory cell array 102 are then programmed on a page basis at step S203. A program loop is set to 1 through the first program operation. The program operation is performed on a page basis in an embodiment of this disclosure, and the memory cells are classified into target program cells and program-inhibited cell on the basis of external input data.

A verification operation is then performed on the programmed memory cells at step S205. The verification operation is a typical operation performed after a program operation in a nonvolatile memory device, and a detailed description thereof is omitted in this disclosure.

Next, whether the verification operation for a selected page is a pass or a fail is checked at step S207. If, as a result of the check, the verification operation for the selected page is a pass, the selected page is treated as a program pass at step S223.

However, if the verification operation for the selected page is a fail at step S207, the start loop value N of a fail bit count corresponding to an address of the selected page is loaded from the option storage unit 118, for example, at step S209. That is, the start loop value N of a fail bit count corresponding to the selected page among the start loop values of fail bit counts set to all the pages stored in the option storage unit 118 is loaded at step S209. As already discussed above, it is also possible that the pages can be classified into one or more groups. Then the start loop value of a fail bit count can be set to each of the groups, and the start loop value of a fail bit count set to a group corresponding to a selected page can be loaded.

The control logic unit 112 determines whether a loop value L of the program operation is less than the start loop value N of the fail bit count corresponding to the selected page at step S211. If, as a result of the determination, the loop value L of the program operation is determined to be equal to or greater than the start loop value N of the fail bit count, the control logic unit 112 performs a fail bit determination operation A shown in FIG. 2 to determine whether the selected page is a program pass on the basis of the number of fail bits included in data read from the programmed memory cells of the selected page. The fail bit determination operation A is described below in detail.

The number of fail bits included in the data read from the memory cells through the verification operation is counted at step S213.

It is then determined whether the number of fail bits is greater than the number of error bits correctable by an ECC circuit at step S215. If, as a result of the determination, the number of fail bits is determined to be equal to or less than the number of error bits correctable by the ECC circuit, the process returns to step S223. However, if, as a result of the determination, the number of fail bits is determined to be greater than the number of error bits correctable by the ECC circuit, the operation for counting the number of fail bits is stopped at step S217.

It is then determined whether the loop value L of the program operation is equal to a maximum loop value at step S219. In an embodiment of this disclosure, the maximum loop value can be determined by a designer with consideration taken of the characteristic of memory cells.

If, as a result of the determination, the loop value L of the program operation is determined to be equal to the maximum loop value, the selected page is treated as a program fail at step S225. However, if, as a result of the determination, the loop value L of the program operation is determined not to be equal to the maximum loop value, the loop value L of the program operation is increased by 1 at step S221, and the steps S203 to S219 are repeatedly performed. The reason why the process is repeated is to reduce the number of error bits by performing a program operation.

Meanwhile, if, as a result of the determination at step S211, the loop value L of the program operation is determined to be less than the start loop value N of the fail bit count, the loop value L of the program operation is increased by 1 at step S221, and the step S203 to S211 are repeatedly performed. As described above, the reason why the process is repeated is to reduce the number of error bits by performing a program operation.

In an embodiment of this disclosure, if a selected page is treated as a program fail, a memory cell block including target program memory cells of the selected page can be treated as a bad block.

As described above, in an embodiment of this disclosure, the start loop value of a fail bit count corresponding to the address of a programmed page is used. Accordingly, a point of time at which fail bits are counted can differ depending on the address of a page. For example, assuming that the start loop value of a fail bit count corresponding to the address of a specific MSB page is 2, when the number of program loops is 2 or more, the number of fail bits is counted. For another example, assuming that the start loop value of a fail bit count corresponding to the address of a specific LSB page is 3, when the number of program loops is 3 or more, the number of fail bits is counted.

In another embodiment of this disclosure, an increasing start loop value (i.e., a higher value) may be set to a page closer to a drain selection line. Alternatively, a decreasing start loop value (i.e., a lower value) may be set to a page closer to a drain selection line. Alternatively, an increasing start loop value (i.e., a higher value) may be set to a page closer to a drain selection line and a source selection line. Alternatively, a decreasing start loop value (a lower value) may be set to a page closer to a drain selection line and a source selection line. In an embodiment of this disclosure, one of the four kinds of setting methods can be selected and the start loop value can be set in accordance with the selected method; however, this is only exemplary according to an embodiment of the present disclosure. Other variations are also possible in the present disclosure such that the start loop value can be set in various other ways depending on the requirements. For example, the start loop value can be set in various ways depending on a distribution of threshold voltages of the memory cells of a nonvolatile memory device.

As described above, in an embodiment of this disclosure, a point of time at which the number of fail bits is counted can differ depending on the address of a page on which a program is performed, thereby enabling an efficient operation.

For example, different points of time at which the number of fail bits is counted are used depending on the address of an MSB page or the address of an LSB page. Accordingly, error bits can be efficiently corrected when a program is performed, and the time taken for a program operation to be executed can be reduced.

What is claimed is:

1. A method of operating a nonvolatile memory device, the method comprising:
    performing a program operation on a page of memory cells selected from a plurality of pages;
    performing a verification operation on the programmed memory cells;
    loading a start loop value of a fail bit count set to the selected page among a plurality of start loop values of fail bit counts set to the corresponding plurality of pages; and
    if a loop value of the program operation is greater than or equal to the start loop value, counting the fail bits in the data of the programmed memory cells detected in the verification operation.

2. The method of claim 1, further comprising, if the loop value of the program operation is less than the start loop value, increasing the loop value of the program operation by 1 and then performing one or more times the steps comprising:
    performing a program operation on a page of memory cells selected from a plurality of pages;
    performing a verification operation on the programmed memory cells; and
    loading a start loop value of a fail bit count set to the selected page among a plurality of start loop values of fail bit counts set to the plurality of pages.

3. The method of claim 1, further comprising:
    determining the selected page as a program pass if the number of counted fail bits after counting the fail bits in the data of the programmed memory cells detected in the verification operation is equal to or less than a number of error bits correctable by an error correction code (ECC) circuit; and
    stopping to count the number of fail bits if the number of counted fail bits is greater than the number of error bits correctable by the ECC circuit.

4. The method of claim 3, further comprising;
    determining the selected page as a program fail after stopping to count the number of fail bits, if the loop value of the program operation is equal to a maximum loop value; and
    increasing the loop value of the program operation by 1 if the loop value of the program operation is not equal to the maximum loop value, and then performing one or more times the steps of:
        performing a program operation on a page of memory cells selected from a plurality of pages;
        performing a verification operation on the programmed memory cells; and
        loading a start loop value of a fail bit count set to the selected page among a plurality of start loop values of fail bit counts set to the corresponding plurality of pages.

5. The method of claim 1, further comprising:
    after performing the verification operation on the programmed memory cells, checking whether the verification operation for the selected page is a pass or a fail; and
    if, as a result of the check, the verification operation for the selected page is a fail, proceeding to a step of loading a start loop value of a fail bit count set to the selected page among a plurality of start loop values of fail bit counts set to the corresponding plurality of pages.

6. The method of claim 1, wherein the start loop value is set to a higher value for a page closer to a drain selection line.

7. The method of claim 1, wherein the start loop value is set to a lower value for a page closer to a drain selection line.

8. The method of claim 1, wherein the start loop value is set to a higher value for a page closer to a source selection line and a drain selection line.

9. The method of claim 1, wherein the start loop value is set to a lower value for a page closer to a source selection line and a drain selection line.

10. A method of operating a nonvolatile memory device, the method comprising:
    classifying a plurality of pages into one or more groups;
    performing a program operation on a page of memory cells selected from the plurality of pages;
    performing a verification operation on the programmed memory cells;
    loading a start loop value of a fail bit count set to a group of the one or more groups to which the selected page is associated with among a plurality of start loop values of fail bit counts set to the corresponding one or more groups; and
    if a loop value of the program operation is greater than or equal to the start loop value of the group to which the selected page is associated with, counting the fail bits in the data of the programmed memory cells detected in the verification operation.

11. The method of claim 10, further comprising, if the loop value of the program operation is less than the start loop value, increasing the loop value of the program operation by 1 and then performing one or more times the steps comprising:
    performing a program operation on a page of memory cells selected from the plurality of pages;
    performing a verification operation on the programmed memory cells; and
    loading a start loop value of a fail bit count set to a group of the one or more groups to which the selected page is associated with among one or more start loop values of fail bit counts set to the corresponding one or more groups.

12. The method of claim 10, further comprising:
determining the selected group as a program pass if the number of counted fail bits after counting the number of fail bits included in the data of the programmed memory cells detected in the verification operation is equal to or less than a number of error bits correctable by an ECC circuit; and
stopping to count the number of fail bits if the number of counted fail bits is greater than the number of error bits correctable by the ECC circuit.

13. The method of claim 12, further comprising:
determining the selected group as a program fail after stopping to count the number of fail bits, if the loop value of the program operation is equal to a maximum loop value; and
increasing the loop value of the program operation by 1 if the loop value of the program operation is not equal to the maximum loop value, and then performing one or more times the steps of:
  performing a program operation on a page of memory cells selected from the plurality of pages;
  performing a verification operation on the programmed memory cells; and
  loading a start loop value of a fail bit count set to a group of the one or more groups to which the selected page is associated with among one or more start loop values of fail bit counts set to the corresponding one or more groups.

14. The method of claim 10, further comprising:
after performing the verification operation on the programmed memory cells, checking whether the verification operation for the selected page is a pass or a fail; and
if, as a result of the check, the verification operation for the selected page is a fail, proceeding to a step of loading a start loop value of a fail bit count set to the selected page among a plurality of start loop values of fail bit counts set to the corresponding plurality of pages.

15. The method of claim 10, wherein the start loop value is set to a higher value for a page closer to a drain selection line.

16. The method of claim 10, wherein the start loop value is set to a lower value for a page closer to a drain selection line.

17. The method of claim 10, wherein the start loop value is set to a higher value for a page closer to a source selection line and a drain selection line.

18. The method of claim 10, wherein the start loop value is set to a lower value for a page closer to a source selection line and a drain selection line.

* * * * *